(12) United States Patent
Chen et al.

(10) Patent No.: US 10,693,103 B2
(45) Date of Patent: Jun. 23, 2020

(54) LIGHT-EMITTING DEVICE AND MANUFACTURING METHOD THEREOF, ELECTRONIC APPARATUS

(71) Applicants: BOE Technology Group Co., Ltd., Beijing (CN); Hefei Xinsheng Optoelectronics Technology Co., Ltd., Hefei (CN)

(72) Inventors: Peng Chen, Beijing (CN); Xinxia Zhang, Beijing (CN)

(73) Assignees: BOE Technology Group Co., Ltd., Beijing (CN); Hefei Xinsheng Optoelectronics Technology Co., Ltd., Hefei, Anhui (CN)

( * ) Notice: Subject to any disclaimer, the term of this patent is extended or adjusted under 35 U.S.C. 154(b) by 0 days.

(21) Appl. No.: 16/142,273

(22) Filed: Sep. 26, 2018

(65) Prior Publication Data

US 2019/0103584 A1 Apr. 4, 2019

(30) Foreign Application Priority Data

Sep. 30, 2017 (CN) .......................... 2017 1 0922434

(51) Int. Cl.
*H01L 51/52* (2006.01)
*H01L 51/56* (2006.01)
*F21V 8/00* (2006.01)
*G02B 6/08* (2006.01)

(52) U.S. Cl.
CPC ........ *H01L 51/5246* (2013.01); *G02B 6/0008* (2013.01); *G02B 6/0066* (2013.01); *G02B 6/08* (2013.01); *H01L 51/5271* (2013.01); *H01L 51/5275* (2013.01); *H01L 51/56* (2013.01)

(58) Field of Classification Search
CPC ..... H01L 51/52; H01L 51/56; H01L 51/5271; H01L 51/5275; H01L 51/5246
USPC .............................................. 257/40, 59, 72
See application file for complete search history.

(56) References Cited

U.S. PATENT DOCUMENTS

| | | | | |
|---|---|---|---|---|
| 2008/0253132 | A1* | 10/2008 | Urabe | G02B 6/0018 362/327 |
| 2013/0094174 | A1* | 4/2013 | Yamamoto | G02B 5/0215 362/19 |
| 2013/0126918 | A1* | 5/2013 | Hsieh | H01L 33/505 257/89 |
| 2013/0214301 | A1* | 8/2013 | Yamada | H01L 33/08 257/88 |
| 2016/0276629 | A1* | 9/2016 | Ma | H01L 27/3246 |
| 2018/0045876 | A1* | 2/2018 | Lee | G02F 1/133528 |
| 2018/0067249 | A1* | 3/2018 | Bang | G02B 6/0055 |

* cited by examiner

*Primary Examiner* — Fazli Erdem
(74) *Attorney, Agent, or Firm* — Banner & Witcoff, Ltd.

(57) ABSTRACT

A light-emitting device and a manufacturing method thereof, and an electronic apparatus are disclosed. The light-emitting device includes: a base substrate, a light-emitting unit, an encapsulation cover plate and a light-guiding structure. The light-emitting unit is on the base substrate; the encapsulation cover plate is opposite to the base substrate and covers the light-emitting unit; and the light-guiding structure is at a light exiting side of the light-emitting unit and includes a plurality of first structures. The light-guiding structure is configured to enable light emitted by the light-emitting unit to be incident into the first structures and enable the light to exit from the encapsulation cover plate.

15 Claims, 11 Drawing Sheets

LIGHT-EMITTING DEVICE AND MANUFACTURING METHOD THEREOF, ELECTRONIC APPARATUS

CROSS-REFERENCE TO RELATED APPLICATION

The present application claims priority of the Chinese Patent Application No. 201710922434.0, filed on Sep. 30, 2017, the disclosure of which is incorporated herein by reference in its entirety as part of the present application.

TECHNICAL FIELD

The embodiments of the present disclosure relate to a light-emitting device and a manufacturing method thereof, and an electronic apparatus.

BACKGROUND

Organic light-emitting diodes (OLED) have characteristics, such as self-luminescence, high brightness, wide viewing angle, high contrast, low energy consumption, etc., and have attracted much attention and have widely been used in mobile phone screens, computer monitors, full-color televisions, etc. In an OLED encapsulation structure or an OLED display device, light is emitted from a side of an encapsulation cover plate or the side, opposite to the encapsulation cover plate, of a base substrate. The light emitted by an OLED element is in all directions, and passes through the space between the encapsulation cover plate and an OLED substrate before exiting from the encapsulation cover plate or from the base substrate as well as two surfaces of the encapsulation cover or the plate base substrate.

SUMMARY

At least an embodiment of the present disclosure provides a light-emitting device, and the light-emitting device includes: a base substrate, a light-emitting unit, an encapsulation cover plate and a light-guiding structure. The light-emitting unit is on the base substrate; the encapsulation cover plate is opposite to the base substrate and covers the light-emitting unit; and the light-guiding structure is at a light exiting side of the light-emitting unit and comprises a plurality of first structures. The light-guiding structure is configured to enable light emitted by the light-emitting unit to be incident into the first structures and enable the light to exit from the encapsulation cover plate.

For example, in the light-emitting device provided by at least one embodiment of the present disclosure, the light-guiding structure is between the light-emitting unit and the encapsulation cover plate, and an end surface, which faces the encapsulation cover plate, of the light-guiding structure contacts with the encapsulation cover plate.

For example, in the light-emitting device provided by at least one embodiment of the present disclosure, the light-guiding structure further includes a second structure, and the second structure covers at least a portion of a side surface of at least one of the first structures; a refractive index of a material of the second structure is less than a refractive index of a material of the first structures.

For example, in the light-emitting device provided by at least one embodiment of the present disclosure, the second structure fills in a space among the plurality of first structures.

For example, in the light-emitting device provided by at least one embodiment of the present disclosure, the material of the first structures is a transparent first inorganic material or a first photoresist material; the material of the second structure is a transparent second inorganic material or a second photoresist material; and the first inorganic material is different from the second inorganic material, and the first photoresist material is different from the second photoresist material.

For example, in the light-emitting device provided by at least one embodiment of the present disclosure, in a direction parallel to the base substrate, a size of a cross-section which is parallel to the base substrate, of each of the plurality of the first structures, is in micron level or nanometer level.

For example, in the light-emitting device provided by at least one embodiment of the present disclosure, plane shapes of the plurality of first structures are arranged in an array or along a plurality of concentric rings.

For example, in the light-emitting device provided by at least one embodiment of the present disclosure, a shape of each of the plurality of concentric rings is a regular curved shape, a regular polygon or an irregular shape.

For example, in the light-emitting device provided by at least one embodiment of the present disclosure, the plurality of first structures of the light-guiding structure have different arrangement densities along a radial direction of the concentric rings.

For example, in the light-emitting device provided by at least one embodiment of the present disclosure, along the radial direction of the concentric rings and along a direction from an innermost ring of the plurality of concentric rings to an outermost ring of the plurality of concentric rings, the arrangement densities of the plurality of first structures of the light-guiding structure decrease gradually.

For example, in the light-emitting device provided by at least one embodiment of the present disclosure, a shape of each of the plurality of first structures of the light-guiding structure is columnar, and a shape of a cross section along a direction perpendicular to the base substrate, of each of the plurality of first structures of the light-guiding structure, is a trapezoid or a rectangle.

For example, in the light-emitting device provided by at least one embodiment of the present disclosure, the light-emitting unit includes an organic light-emitting diode (OLED) element or an electroluminescent (EL) element.

At least an embodiment of the present disclosure further provides an electronic apparatus, and the electronic apparatus includes at least one light-emitting device of any type provided by the embodiments of the present disclosure.

At least an embodiment of the present disclosure further provides a method of manufacturing a light-emitting device, and the manufacturing method includes: providing a base substrate and an encapsulation cover plate; forming a light-emitting unit on the base substrate; forming a light-guiding structure at a light exiting side of the light-emitting unit; and enabling the encapsulation cover plate to be opposite to the base substrate and boding the encapsulation cover plate and the base substrate, so that the light-emitting unit is encapsulated and is between the base substrate and the encapsulation cover plate; forming a light-guiding structure includes forming a plurality of first structures to enable light emitted by the light-emitting unit to be incident into the first structures and enable the light to exit from the encapsulation cover plate.

For example, in the method of manufacturing the light-emitting device provided by at least one embodiment of the present disclosure, forming a light-guiding structure includes: forming a second structure of the light-guiding structure; the second structure covers at least a portion of a side surface of at least one of the first structures, and a refractive index of a material of the second structure is less than a refractive index of a material of the first structures.

For example, in the method of manufacturing the light-emitting device provided by at least one embodiment of the present disclosure, the second structure fills in a space among the plurality of first structures.

For example, in the method of manufacturing the light-emitting device provided by at least one embodiment of the present disclosure, in a direction parallel to the base substrate, a size of a cross-section which is parallel to the base substrate, of each of the plurality of the first structures, is in micron level or nanometer level.

For example, in the method of manufacturing the light-emitting device provided by at least one embodiment of the present disclosure, plane shapes of the plurality of first structures are arranged in an array or along a plurality of concentric rings.

For example, in the method of manufacturing the light-emitting device provided by at least one embodiment of the present disclosure, the plurality of first structures of the light-guiding structure have different arrangement densities along a radial direction of the concentric rings.

For example, in the method of manufacturing the light-emitting device provided by at least one embodiment of the present disclosure, the light-guiding structure is formed by a process of photolithography or embossing.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
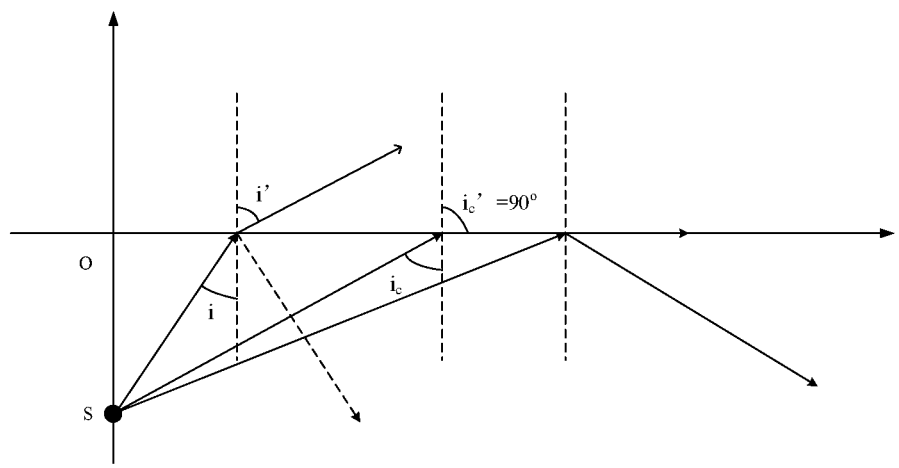
FIG. 1 is a principle scheme diagram of total reflection of light.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "in," "outside," "on" "under," and the like are only used to indicate relative position relationship, and when the position of the object which is described is changed, the relative position relationship may be changed accordingly.

The figures used to describe the embodiments of the present disclosure are not drawn according to actual proportions or scales, the number of the first structures in the light-emitting device can be determined according to the actual requirement, and sizes and numbers of all the structures are determined according to the actual requirement. In the schematic view of the plane shape of the light-emitting device, the plane shape of an arrangement of the first structures are mainly illustrated, and other structures can be referred to the cross-sectional view of the light-emitting device. The figures of the embodiments of the present disclosure are only schematic views.

The term "irregular shape" in the present disclosure refers to shapes except regular curved shapes (for example, circles, ellipses, etc.) and regular polygons (for example, rectangles, regular triangles, regular pentagons, etc.), such as fan shapes, irregular polygons, etc.

The term "cover" in the present disclosure is explained in the following. For example, if it is mentioned that A covers B, it refers to the case that at least a portion of A's orthographic projection on the base substrate overlaps at least a portion of B's orthographic projection on the substrate.

For example, the radial direction of the concentric rings recited in the present disclosure refers to the direction of a straight line in which a radius of a circle lies, and the circle is centered at the center of the concentric rings. For another example, if the shape of each of the concentric rings is a rectangle, taking an intersection of diagonals of the rectangle as the center, the radial direction of the concentric rings refers to the direction of a straight connecting line which connects any point on the edge of the rectangle and the center.

Total reflection refers to the phenomenon that all light is reflected back to an original medium at an interface of an optically denser medium (the medium in which light has a larger refractive index, hereinafter referred to as a medium with a larger refractive index) and an optically thinner medium (the medium in which light has a smaller refractive index, hereinafter referred to as a medium with a smaller refractive index) when the light is incident from the optically denser medium to the optically thinner medium. As illustrated in FIG. 1, when the light is transmitted from the optically denser medium to the optically thinner medium, the refraction angle of the light is larger than the incident angle of the light. In the case where the incident angle i increases to a certain value, the refraction angle reaches 90°, and refraction light disappear in the optically denser medium, and the certain value is referred to as a critical angle $i_c$. As long as the incident angle is larger than or equal to the critical angle $i_c$, incident light is not refracted but totally reflected, and this phenomenon is called as total reflection. The necessary conditions of the total reflection include: (1) light is transmitted from the optically denser medium to the optically thinner medium; and (2) the incident angle is larger than or equal to the critical angle $i_c$. The formula is as follows: $i_c=\arcsin(n_2/n_1)$, in which $n_1$ is a refractive index of the optically denser medium, $n_2$ is a refractive index of the optically thinner medium, and $n_1>n_2$.

In an OLED encapsulation structure and an OLED display apparatus, light emitted by an OLED device is in all directions, and is required to pass through the space between the encapsulation cover plate and an OLED substrate before exiting from the encapsulation cover plate or from the base substrate as well as two surfaces of the encapsulation cover plate or the base substrate. In this case, the optical path for the light to be emitted out of the OLED encapsulation structure or the OLED display apparatus is long, the light passes through many interfaces, and the total reflection on the interfaces causes more light loss, which results in a low light emitting ratio and a low light utilization ratio of the OLED device.

At least an embodiment of the present disclosure provides a light-emitting device, and the light-emitting device includes: a base substrate, a light-emitting unit, an encapsulation cover plate and a light-guiding structure. The light-emitting unit is provided on the base substrate; the encapsulation cover plate is opposite to the base substrate and covers the light-emitting unit; and the light-guiding structure is provided at a light exiting side of the light-emitting unit and comprises a plurality of first structures. The light-guiding structure is configured to enable light emitted by the light-emitting unit to be incident into the first structures and enable the light to exit from the encapsulation cover plate.

Figure 2:
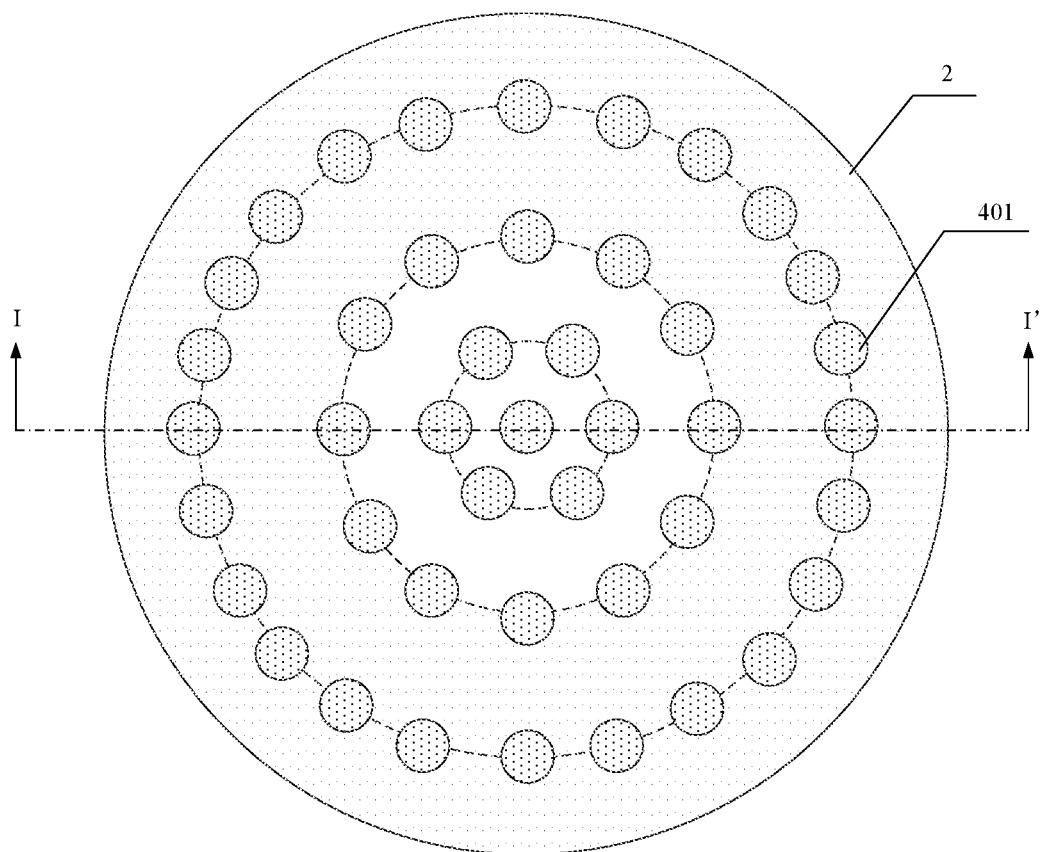
FIG. 2 is a schematic view of a plane shape of the light-emitting device provided by at least one embodiment of the present disclosure.
Figure 3:
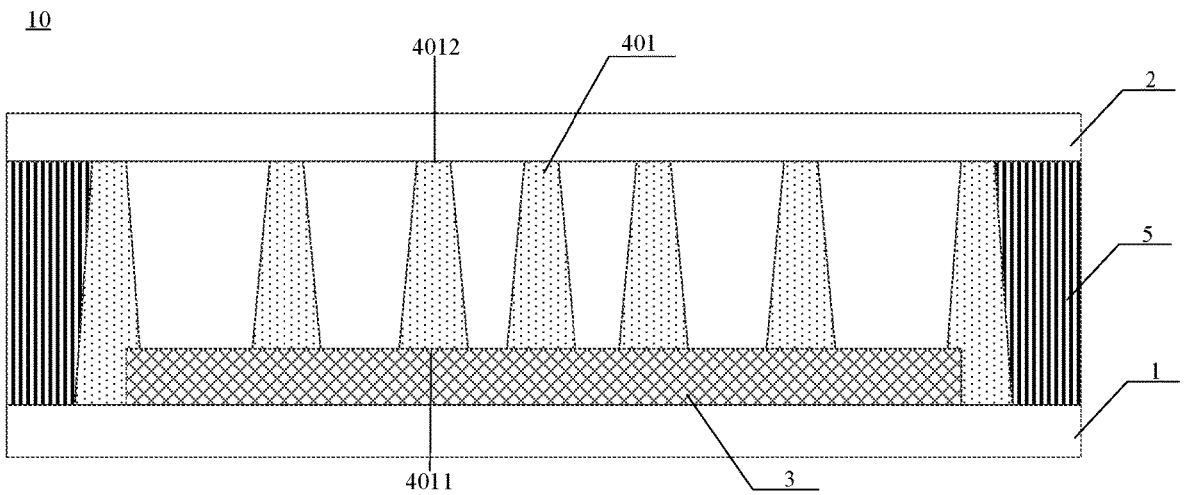
FIG. 3 is a cross-sectional view along a line I-I' illustrated in FIG. 2.
Figure 4:
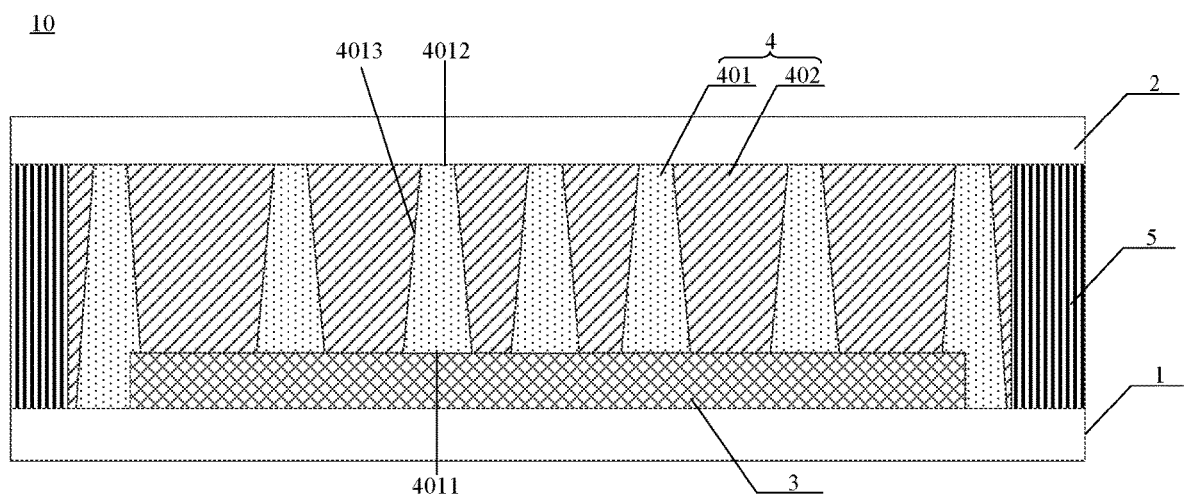
FIG. 4 is another cross-sectional view along the line I-I' illustrated in FIG. 2.
Figure 5:
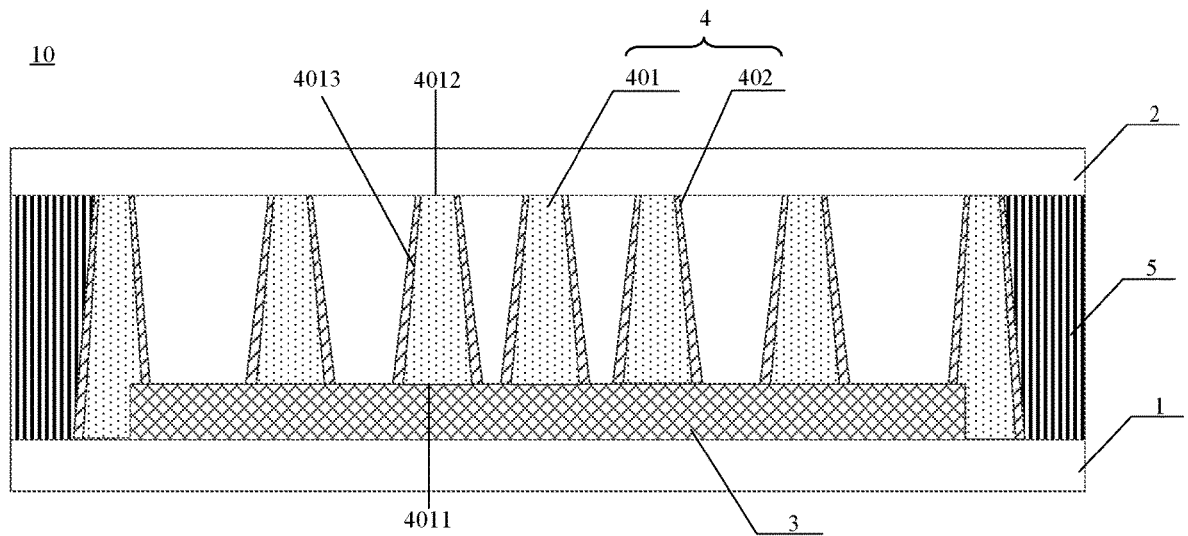
FIG. 5 is further another cross-sectional view along the line I-I' illustrated in FIG. 2.

Exemplary, FIG. 2 is a schematic view of a plane shape of the light-emitting device provided by at least one embodiment of the present disclosure, FIG. 3 is a cross-sectional view along a line I-I' illustrated in FIG. 2, FIG. 4 is another cross-sectional view along the line I-I' illustrated in FIG. 2, and FIG. 5 is further another cross-sectional view along the line I-I' illustrated in FIG. 2.

In an embodiment illustrated in FIG. 3, a light-emitting device 10 includes a base substrate 1, a light-emitting unit 3, an encapsulation cover plate 2 and a light-guiding structure. The light-emitting unit 3 is on the base substrate 1. For example, the light-emitting unit 3 is an organic light-emitting diode (OLED) element, quantum dot light-emitting diode (QLED), or an electroluminescent (EL) element (for example, an organic electroluminescent element), and for example, the OLED element is in a top emitting structure or a bottom emitting structure, etc. For example, the OLED element includes a cathode on the base substrate 1, an organic light-emitting layer on the cathode and a transparent anode on the organic light-emitting layer, and for example, the cathode is a reflection electrode, or a reflection layer adjacent to the cathode is provided, and in this case the light emitting side of the light-emitting unit 3 is the top side of the light-emitting unit 3 as illustrated in FIG. 3. In another example, the OLED element includes an anode on the base substrate 1, an organic light-emitting layer on the anode and a cathode on the organic light-emitting layer, and for example, the anode is a reflection electrode, or a reflection layer adjacent to the anode is provided, thus in this case the light emitting side of the light-emitting unit 3 is still the top side of the light-emitting unit 3 illustrated in FIG. 3.

The encapsulation cover plate 2 is opposite to (parallel with) the base substrate 1 and covers the light-emitting unit 3. The encapsulation cover plate 2 is a glass substrate or a plastic substrate, etc. Light emitted by the organic light-emitting layer of the light-emitting unit 3 is emitted from the top side of the light-emitting unit 3 and exits from the encapsulation cover plate finally.

For example, the base substrate 1 includes a glass substrate or a quartz substrate or a plastic substrate, etc., and the base substrate 1 can include structures or components such as a driving circuit (e.g., for each sub-pixel), a buffer layer, etc. according to requirements. For example, the driving circuit includes a power line, a driving transistor, etc. so as to control whether the light-emitting unit 3 is drive to emit light and control the intensity of the light emitted by the light-emitting unit 3.

For example, the light-guiding structure is at the top side of the light-emitting unit 3 and includes a plurality of first structures 401. For example, the shape of at least one or each of the plurality of first structures 401 is columnar, that is, in a column shape. For example, the light-guiding structure is provided or interposed between the light-emitting unit 3 and the encapsulation cover plate 2, and the first surfaces 4011, which face the base substrate 1, of the first structures 401 in the central region of the light-emitting unit 3 contact with the surface, which is at the light emitting side, of the light-emitting unit 3; the bottom surfaces, which face the base substrate 1, of the first structures 401 in a marginal region (or edge region) of the light-emitting unit 3 contact with the base substrate 1, and the first structures 401 cover a lateral side surface of the light-emitting unit 3 and a portion of the surface, which is at the light emitting side, of the light-emitting unit 3; the second surfaces (end surface) 4012, which face the encapsulation cover plate 2, of the plurality of first structures 401 contact with the encapsulation cover plate 2. It should be noted that the term "contact" refers to that no other structure is between the surfaces that are in contact with each other, that is, no other structure is interposed between the second surfaces 4012, which face the encapsulation cover plate 2, of the plurality of first structures 401 and the encapsulation cover plate 2. In this way, light incident into the first structures 401 enters the encapsulation cover plate 2 through the second surfaces 4012 of the plurality of first structures 401, without passing through any other medium except the second surface 4012, so the loss of light is reduced by shortening the optical path.

For example, protective gas, such as nitrogen or inert gas, etc., is filled among the plurality of first structures 401. In this way, at least a part of the light emitted by the light-emitting unit 3 is incident into the first structures 401 through the first surfaces 4011 of the first structures 401 without passing through any other medium except the first surfaces 4011 and exits from the encapsulation cover plate 2. Because the refractive index of the material of the first structures 401 is greater than the refractive index of the nitrogen or the inert gas, in a case where light incident to the first surfaces 4011 of the first structures 401 reaches the interface of the first surface 4011 with the gas around the first structures 401, a part of the light is transmitted by total reflection on the interface (similar to that light is transmitted in an optical fiber). The light from the light-emitting unit 3, for example, is vertically or non-vertically incident to the first surfaces 4011 of the first structures 401, and the light is refracted into the first structures 401 which are columnar, then the light satisfying the conditions of total reflection is transmitted to the second surfaces 4012 from the first surfaces 4011 of the first structures 401 after multiple total reflections, then exits through the encapsulation cover plate 2. In this way, the loss of light at positions of the first structures 401 can be reduced and a light emitting ratio is increased, thus local brightness is increased. A part of the light from the light-emitting unit 3 is vertically incident into the first structures 401, and this part of the light exits from the encapsulation cover plate 2 along the direction vertical to the encapsulation cover plate 2 without multiple reflections, so the optical path is shortened, the loss of light caused by interface reflection, and the light emitting ratio is increased as well. Not only the local light emitting efficiency at the positions of the first structures 401 is increased but also the overall light emitting ratio of the light-emitting unit 3 is increased, thus the utilization efficiency of light is increased.

For example, in at least one embodiment of the present disclosure, the light-guiding structure further includes a second structure, and the second structure covers at least a portion of the side surface of at least one of the first structures, and the refractive index of the material of the second structure is less than the refractive index of the material of the first structures. Exemplary, as illustrated in FIG. 4, the light-guiding structure 4 further includes a second structure 402, compared with the example as illustrated in FIG. 3. For example, the second structure 402 covers the side surface 4013 of each of the first structures 401, and the second structure 402 fills in the space among the plurality of first structures 401. It can be understood that the nitrogen or the inert gas in the embodiment illustrated in FIG. 3 is replaced by the second structure 402 with a lower refractive index compared with the refractive index of the first structures 401. In this way, in a case where a part of the light from the light-emitting unit 3 is vertically incident into the first structures 401, this part of the light still exits from the encapsulation cover plate 2 along the direction vertical to the encapsulation cover plate 2, so the technical effect of reducing the optical path, reducing the loss of light caused by interface reflection and increasing the light emitting ration is achieved. In a case where a part of the light from the light-emitting unit 3 is non-vertically incident to the first surfaces 4011 of the first structures 401 and this part of light is incident to the interface of the first structures 401 with the second structure 402, because the refractive index of the material of the second structure 402 is less than the refractive index of the material of the first structures 401, light satisfying the conditions of total reflection is transmitted to the second surfaces 4012 from the first surfaces 4011 of the first structures 401 after multiple total reflections, then exits through the encapsulation cover plate 2. In addition, because a part of the light in the first structures 401 is totally reflected, the loss of light in the first structures 401 is less than the loss of light in the second structure 402, the light emitting ratio at the positions of the first structures 401 is greater than the light emitting ration at the positions of the second structure 402, and the brightness at the positions of the first structures 401 is greater than the brightness at the positions of the second structure 402. Thus, the embodiment illustrated in FIG. 4 can achieve the technical effect that is the same as or similar to that of the embodiment illustrated in FIG. 3.

For example, in an embodiment illustrated in FIG. 4, the surface, which faces the encapsulation cover plate 2, of the second structure 402 of the light-guiding structure 4, and the first surfaces 4011, which face the encapsulation cover plate 2, of the first structures 401, are roughly in a same plane, so that the light-guiding structure 4 has a substantially flat upper surface, which is beneficial to arrange or form the encapsulation cover plate 2 on the upper surface and enable the encapsulation cover plate 2 to be bonded with the light-guiding structure 4 more tightly. In this way, on one hand, the optical path is shortened and interface total reflection is reduced, thus the light emitting ratio is increased; on the other hand, more tight seal is realized to protect the light-emitting unit 3 better and the service life of the light-emitting unit 3 is extended.

For example, in another embodiment of the present disclosure, as illustrated in FIG. 5, the second structure 402 of the light-guiding structure 4 also covers a side surface (lateral side surface) 4013 of at least one of the first structures 4, for example, the second structure 402 covers the side surface 4013 of each of the first structures 4, but the second structure 402 does not fill in all the space among the plurality of first structures 401. Similarly, the refractive index of the material of the second structure 402 is less than the refractive index of the material of the first structures 401. Other structures of the light-emitting device 10 in the embodiment illustrated in FIG. 5 are the same as those in FIG. 3 and FIG. 4. Similarly, the embodiment illustrated in FIG. 5 can achieve the technical effect that is similar to or the same as that of any of the embodiments illustrated in FIG. 3 and FIG. 4, and the description thereof is not repeated here.

For example, in the embodiments illustrated in FIG. 4 and FIG. 5, the material of the first structures 401 of the light-guiding structure 4 is a transparent first inorganic material, and the material of the second structure 402 of the light-guiding structure 4 is a transparent second inorganic material. The first inorganic material is different from the second inorganic material, and the refractive index of the second inorganic material is less than the refractive index of the first inorganic material. For example, the first inorganic material includes a material with a greater refractive index, such as silicon nitride, silicon dioxide or titanium dioxide, etc., the second inorganic material includes a material with a less refractive index, such as magnesium fluoride, porous silicon dioxide or silicon oxyfluoride, etc. Or, the material of the first structures 401 is a first photoresist material, for example, a first resin material mixed with a positive photoresist or a negative photoresist; the material of the second structure 402 is a second photoresist material, for example, a second resin material mixed with a positive photoresist or a negative photoresist. In this way, the first structures 401 and the second structure 402 can be formed by exposure and development, which omits an etching step in a preparation process and simplifies a manufacturing process of the light-guiding structure 4. The first photoresist material is different from the second photoresist material, the refractive index of the second resin used for forming the second photoresist material is less than the refractive index of the first resin used for forming the first photoresist material, and the refractive index of the second photoresist material is less than the refractive index of the first photoresist material. For example, the first resin is polystyrene (PS), or polycarbonate (PC), or epoxy resin with a high refractive index caused by sulfur, halogen or other atoms which can bring a high refractive index, etc. The second resin is a resin with a less refractive index, such as polymethyl methacrylate (PMMA) or polyallyldiethylene glycol carbonate (PADC), etc. It should be noted that the material of the first structures 401 and the material of the second structure 402 can also be other transparent materials satisfying the condition that the refractive index of the material of the second structure 402 is less than the refractive index of the material of the first structures 401, and the material of the first structures 401 and the material of the second structure 402 are not limited to the above-mentioned types.

For example, in the direction parallel to the base substrate 1, the size of a cross-section which is parallel to the base substrate 1, of each of the plurality of the first structures 401, is in micron level or nanometer level, for example, 8 µm~100 µm, or much smaller, such as 700 nm~900 nm. For example, the shape of the cross-section which is parallel to the base substrate, of each of the plurality of the first structures, is circular, and the diameter of the circle is in micron level or nanometer level. In a case the cross-section is circular, the manufacturing process of the first structures 401 is simplified. Of course, the shape of the cross-section can also be a polygon (for example, a rectangle or a pentagon), etc., but the shape of the cross-section is not limited to a circle or a polygon. Compared with the first structures 401 with a larger size, the first structures 401 with a size in micron level or nanometer level is more beneficial to reduce the loss of light and increasing the light emitting efficiency. Moreover, the local brightness of the first structures 401 is higher; if the size of the cross-section which is parallel to the base substrate, of each of the plurality of the first structures 401, reaches micron level or nanometer level, in a case where the first structures 401 are distributed uniformly on the light emitting unit 3, a uniform luminous effect is achieved; in a case where it is required to design a certain pattern of light emitting, a required effect is achieved by designing the positions of the plurality of first structures 401. For example, in this way, the plurality of first structures 401 can produce a luminous effect like halo.

It should be noted that what is illustrated in FIG. 2-FIG. 4 is one light-emitting unit of the light-emitting device 10, and the light-emitting device 10 can include a plurality of similar light-emitting units. For example, the plurality of light-emitting units are arranged in an array.

For example, plane patterns of the plurality of first structures 401 are arranged along a plurality of concentric rings. Because at the positions of the first structures 401 and the light emitting efficiency is higher and the local brightness is higher, the luminous effect of the plurality of concentric rings is achieved. For example, the shape of each of the plurality of concentric rings is a regular curved shape, a regular polygon or an irregular shape. Exemplary, as illustrated in FIG. 2, the plane shapes of the plurality of first structures 401 are arranged along a plurality of concentric circular rings, so the luminous effect of concentric circular rings is achieved.

For example, the plurality of first structures 401 of the light-guiding structure have different arrangement densities along the radial direction of the concentric rings. For example, along the radial direction of the concentric rings and along a direction from the innermost ring of the plurality of concentric rings to the outermost ring of the plurality of concentric rings, the arrangement densities of the plurality of first structures 401 of the light-guiding structure 4 decrease gradually, that is, distances between every two adjacent rings of the plurality of concentric rings increases gradually. For example, in a region where the arrangement densities of the plurality of first structures 401 are larger, the distance between two adjacent rings is 8 µm~15 µm; in a region where the arrangement densities of the plurality of first structures 401 are smaller, the distance between two adjacent rings is 100 µm~200 µm. The positions of the plurality of first structures 401 can be designed according to required patterns of the luminous effect, limitations are not imposed to values of the distance between two adjacent rings in the embodiments of the present disclosure. In the embodiment illustrated in FIG. 2, because along the radial direction of the concentric rings and along the direction from the innermost ring of the plurality of concentric rings to the outermost ring of the plurality of concentric rings, the distance between two adjacent rings increases gradually, and the size of the cross-section which is parallel to the base substrate 1, of each of the plurality of the first structures 401, is in micron level or nanometer level, the luminous effect like halo is achieved.

Figure 6A:
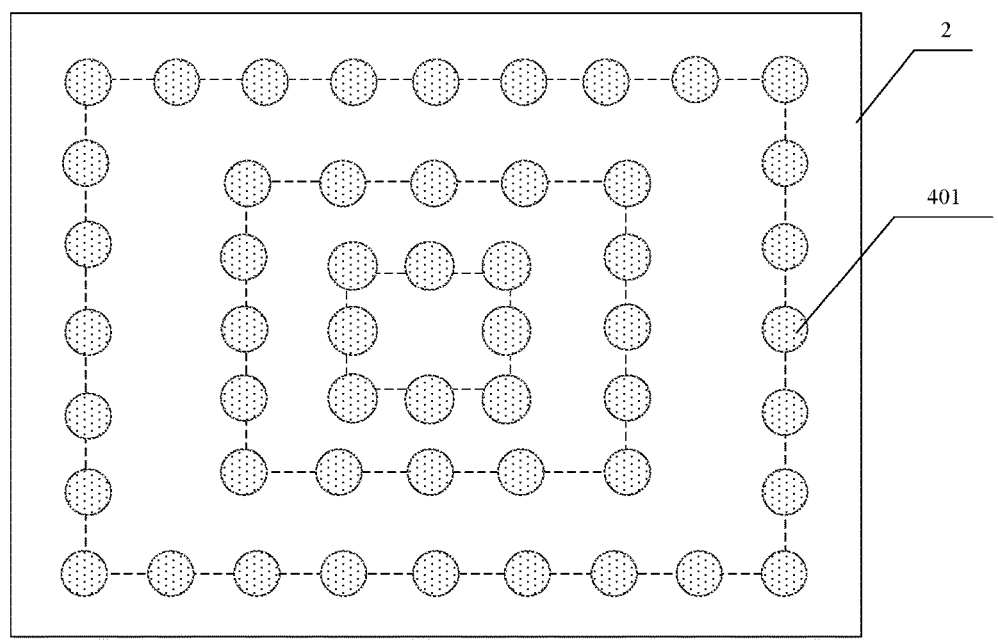
FIG. 6A is another schematic view of a plane shape of the light-emitting device provided by at least one embodiment of the present disclosure.

For example, as illustrated in FIG. 6A, the above-mentioned concentric rings are concentric rectangular rings, so the luminous effect of concentric rectangular rings is achieved.

In a case where the light-emitting device 10 is applied to a lighting apparatus, such as a luminaire, the luminous effect of concentric rings has a function of decoration. For example, a single light-emitting device 10 is applied to achieve a desired luminous pattern; or, a plurality of light-emitting device 10 which can form different luminous patterns are applied to form the luminous effect of combinations of various luminous patterns.

Figure 6B:
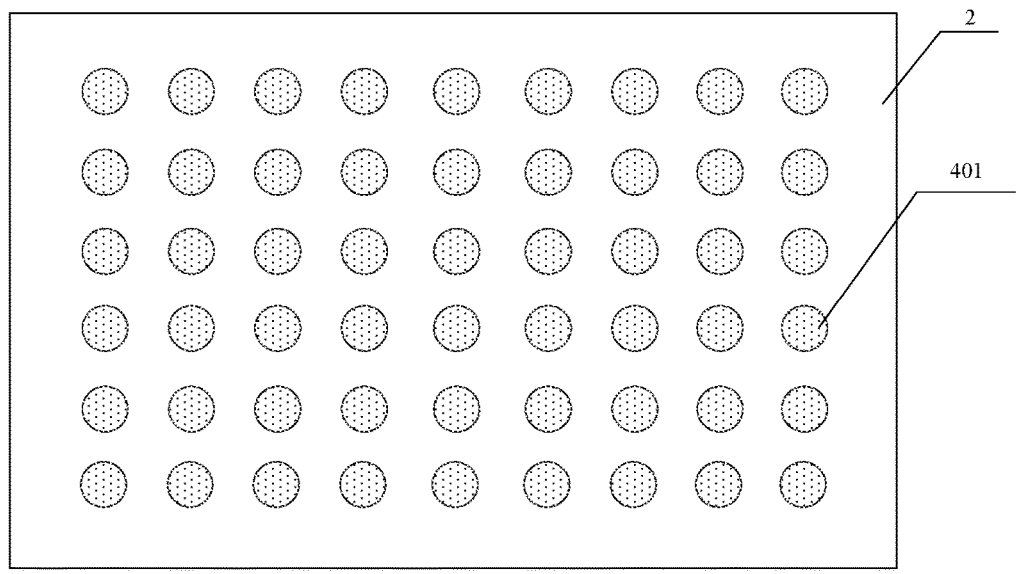
FIG. 6B is further another schematic view of a plane shape of the light-emitting device provided by at least one embodiment of the present disclosure.

It should be noted that the shapes of the concentric rings illustrated in FIG. 2 and FIG. 6 are only two examples, the shape of the concentric rings in the embodiments of the present disclosure are not limited to the above-mentioned types, for example, the shape of the concentric rings can also be sector rings, elliptical rings, or irregular polygons (such as pentagonal stars) or irregular curved rings, etc. Those skilled in the art can design according to actual requirements.

For example, the plane shapes of the plurality of first structures 401 can also be arranged in an array. As illustrated in FIG. 6, the plane shapes of the plurality of first structures 401 are arranged in an array and are uniformly distributed on the base substrate 1, so that the light-emitting device 10 achieves a uniform luminous effect to satisfy a requirement of apparatuses that requires a uniform luminescence. For example, the light-emitting device 10 can be applied to a display apparatus.

Figures 7A, 7B, 7C:
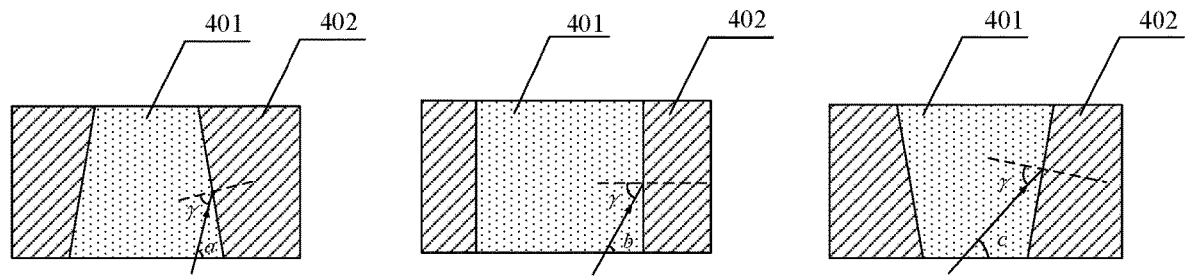
FIG. 7A is a cross-sectional view, in a direction perpendicular to the base substrate, of the first structure of the light-guiding structure.
FIG. 7B is another cross-sectional view, in a direction perpendicular to the base substrate, of the first structure of the light-guiding structure.
FIG. 7C is further another cross-sectional view, in a direction perpendicular to the base substrate, of the first structure of the light-guiding structure.

For example, the shape of a cross-section, along the direction perpendicular to the base substrate 1, of each of the plurality of first structures 401 of the light-guiding structure 4, is a trapezoid or a rectangle. As illustrated in FIG. 7A, the cross section along the direction perpendicular to the base substrate of each of the plurality of first structures 401 is a trapezoid, and the length of the upper bottom of the trapezoid is less than the length of the lower bottom of the trapezoid. In a case where the light from the light-emitting unit 3 is incident to the interface of the first structures 401 and the second structure 402, the critical angle of total reflection is γ. In a case where an incident angle of the light is larger than the critical angle γ, the light is totally reflected. In a case where an incident angle of the light is equal to γ, the angle between incident light and the base substrate 1 is α, thus if the angle between the incident light and the base substrate 1 is larger than α, and the incident angle of the incident light is larger than γ, all the incident light is reflected. Furthermore, according to the principle of the total reflection, the greater the difference between the refractive index of the second structure 402 and the refractive index of the first structures 401, the smaller the critical angle C, and the wider the range of light that is totally reflected. In FIG. 3-FIG. 5, the shape of the cross-section, along the direction perpendicular to the base substrate, of each of the plurality of first structures 401, is the example illustrated in FIG. 7A, but the shape of the cross-section is not limited to the example illustrated in FIG. 7A.

For example, the cross section, along the direction perpendicular to the base substrate, of each of the plurality of first structures 401 is a rectangle as illustrated in FIG. 7B or a trapezoid as illustrated in FIG. 7C, and the length of the upper bottom of the trapezoid is larger than the length of the lower bottom of the trapezoid. In FIG. 7B, the critical angle of total reflection is γ. In a case where the incident angle of the light is equal to γ, the angle between incident light and the base substrate 1 is b. Similarly, if the angle between the incident light and the base substrate 1 is larger than b, all the incident light is reflected. In FIG. 7C, the critical angle of total reflection is γ. In a case where the incident angle of the light is equal to γ, the angle between incident light and the base substrate 1 is c. Similarly, if the angle between the incident light and the base substrate 1 is larger than c, all the incident light is reflected. Obviously, c<b<α. Therefore, the range of light that is totally reflected at the interface of the first structures 401 with the second structure 402 in the case illustrated in FIG. 7A, the range of light that is totally reflected at the interface of the first structures 401 with the second structure 402 in the case illustrated in FIG. 7B and the range of light that is totally reflected at the interface of the first structures 401 with the second structure 402 in the case illustrated in FIG. 7C increase successively, and the increase of the range of light that is totally reflected is beneficial to increase the light emitting efficiency at the positions of the first structures 401 and increase the local brightness, so a better luminous effect of a special pattern (for example, the above-mentioned concentric rings) can be achieved. Besides, the increase of the range of light that is totally reflected is also beneficial to increase an overall light emitting efficiency of light-emitting device.

At least an embodiment of the present disclosure further provides an electronic apparatus, and the electronic apparatus includes at least one light-emitting device of any type provided by the embodiments of the present disclosure.

Figure 8:
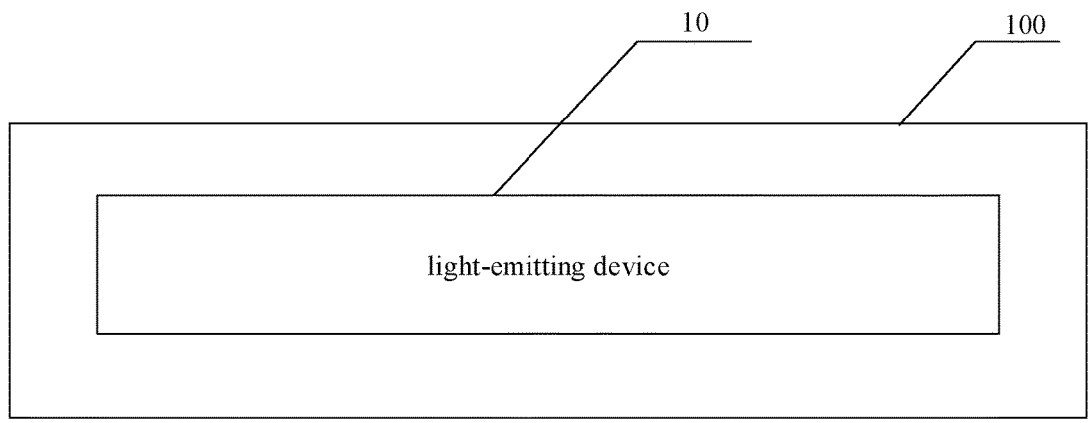
FIG. 8 is a schematic view of the electronic apparatus provided by at least one embodiment of the present disclosure.

Exemplary, FIG. 8 is a schematic view of the electronic apparatus provided by at least one embodiment of the present disclosure. As illustrated in FIG. 8, an electronic apparatus 100 provided by at least one embodiments of the present disclosure includes at least one light-emitting device of any type provided by the embodiments of the present disclosure. For example, the electronic apparatus 100 is a display apparatus, a lighting apparatus or a backlight apparatus, etc. For example, the electronic apparatus 100 is an organic light-emitting diode display apparatus, and for example, the backlight apparatus is one which can be applied to a liquid crystal display panel or an electronic paper display panel. For example, the display apparatus can be realized as follows: any products or components having display function as follows: mobile phone, panel computer, TV set, display monitor, laptop, digital photo frame, navigation instrument or the like.

For example, in the electronic apparatus 100, the plane shapes of the plurality of first structures are arranged along a plurality of concentric rings. For example, in a case where the electronic apparatus 100 is a lighting apparatus (for example, a decorative lantern), because the plane shapes of the plurality of first structures are arranged along a plurality of concentric rings, the lighting apparatus can achieve the luminous effect of concentric rings and can form luminous effects of concentric rings of various luminous patterns, and the luminous effect of concentric rings has the function of decoration. The detailed description about the concentric rings can be referred to the descriptions in the above embodiments, and no repeated description is given here.

For example, in a case where the electronic apparatus 100 is a display apparatus, in the whole display panel of the display apparatus, the plane shapes of the plurality of first structures are arranged in an array and are uniformly distributed on the base substrate, so that the light-emitting device 10 achieves a uniform luminous effect to satisfy a requirement of apparatuses that requires a uniform luminescence. For example, the light-emitting device 10 can be applied to a display apparatus. Limitations are not imposed to other structures of the electronic apparatus in the embodiments of the present disclosure.

At least an embodiment of the present disclosure further provides a method of manufacturing a light-emitting device, and the manufacturing method includes: providing a base substrate and an encapsulation cover plate; forming a light-emitting unit on the base substrate; forming a light-guiding structure at a light exiting side of the light-emitting unit; and enabling the encapsulation cover plate to be opposite to the base substrate and boding the encapsulation cover plate and the base substrate, so that the light-emitting unit is encapsulated and is between the base substrate and the encapsulation cover plate; forming a light-guiding structure includes forming a plurality of first structures to enable light emitted by the light-emitting unit to be incident into the first structures and enable the light to exit from the encapsulation cover plate.

Figure 9A:
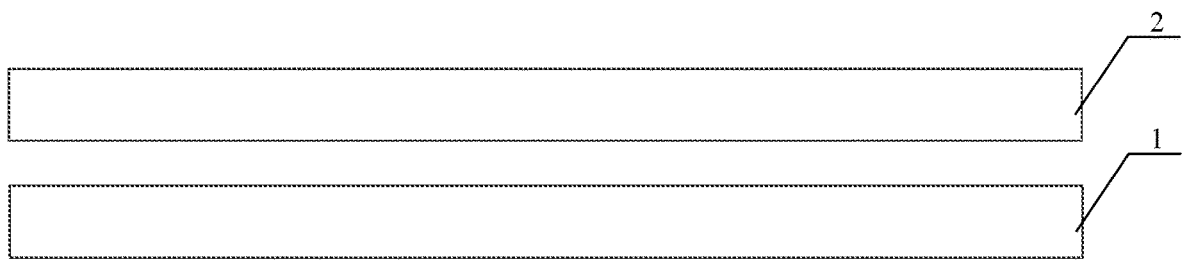
FIGS. 9A-9F are schematic views of the method of manufacturing the light-emitting device provided by at least one embodiment of the present disclosure.
Figure 9B:
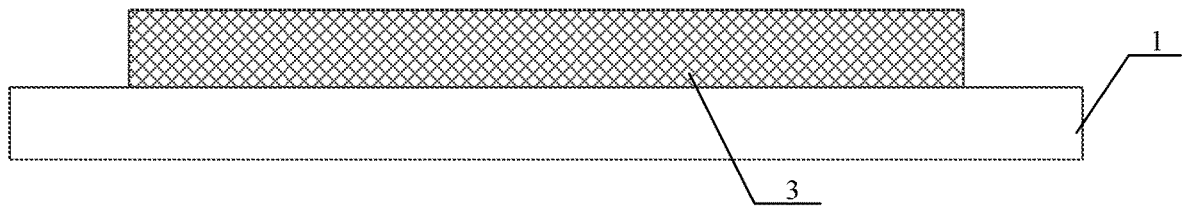
Figure 9C:
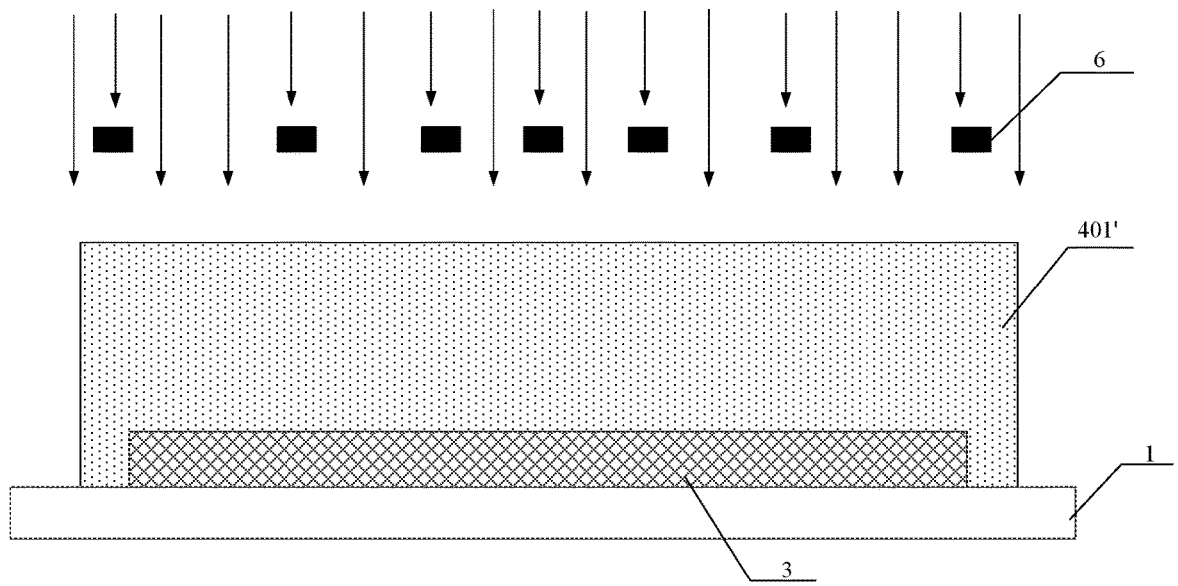
Figure 9D:
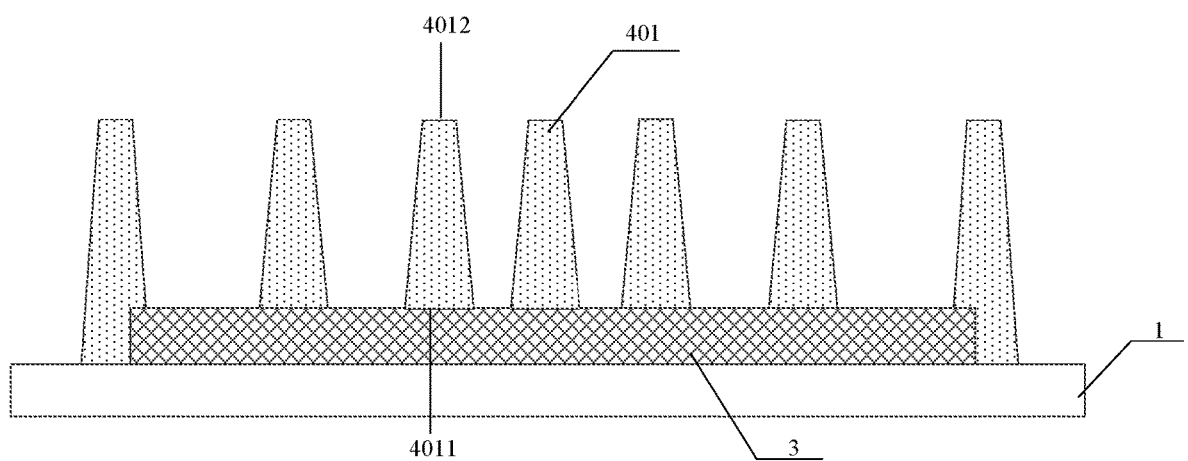
Figure 9E:
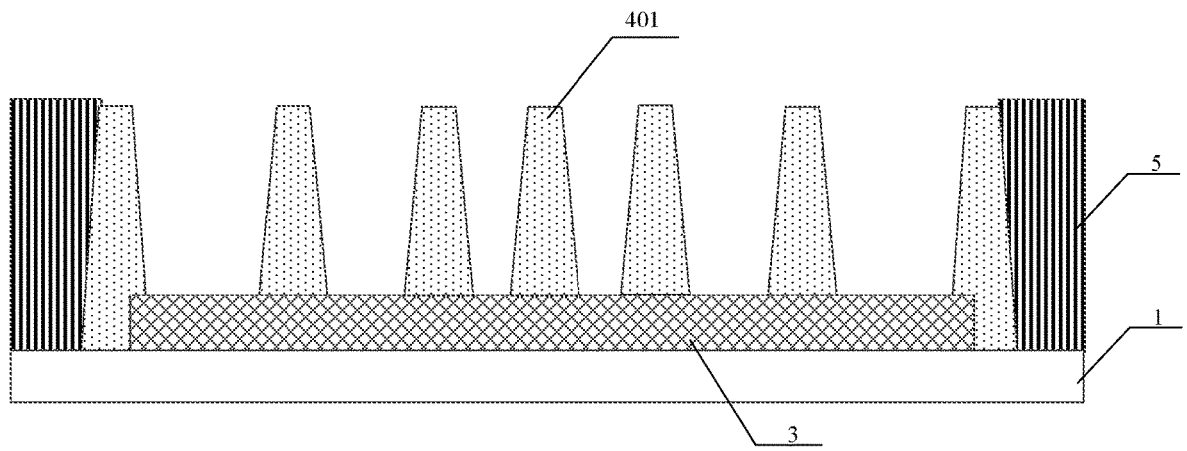
Figure 9F:
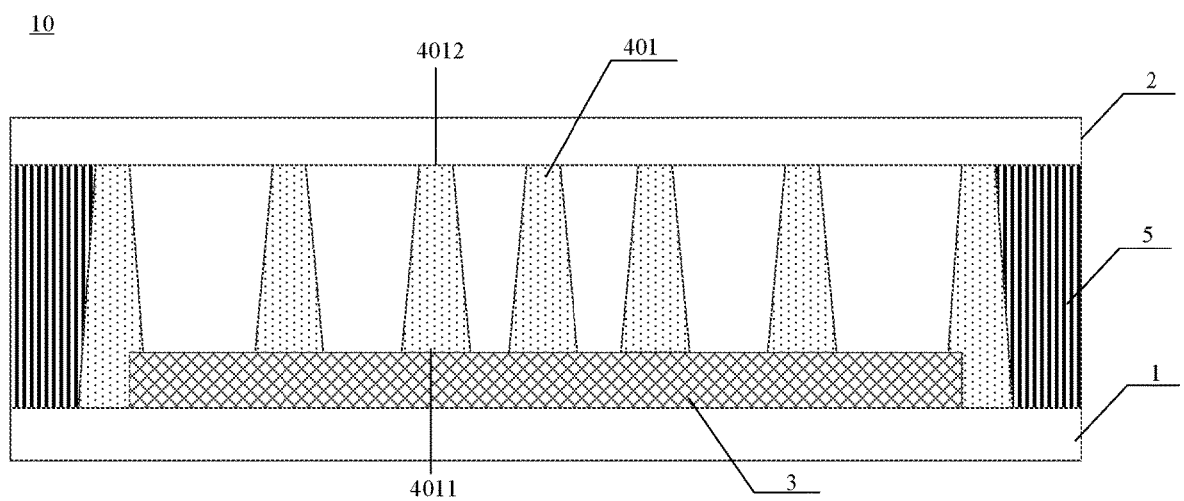
Figure 10A:
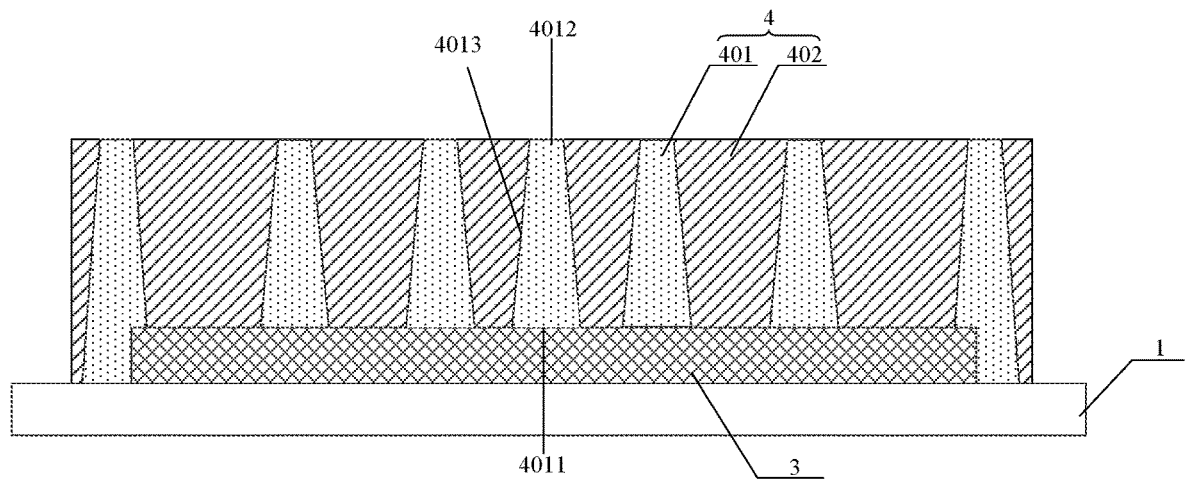
FIGS. 10A-10C are schematic views of another method of manufacturing the light-emitting device provided by at least one embodiment of the present disclosure.
Figure 10B:
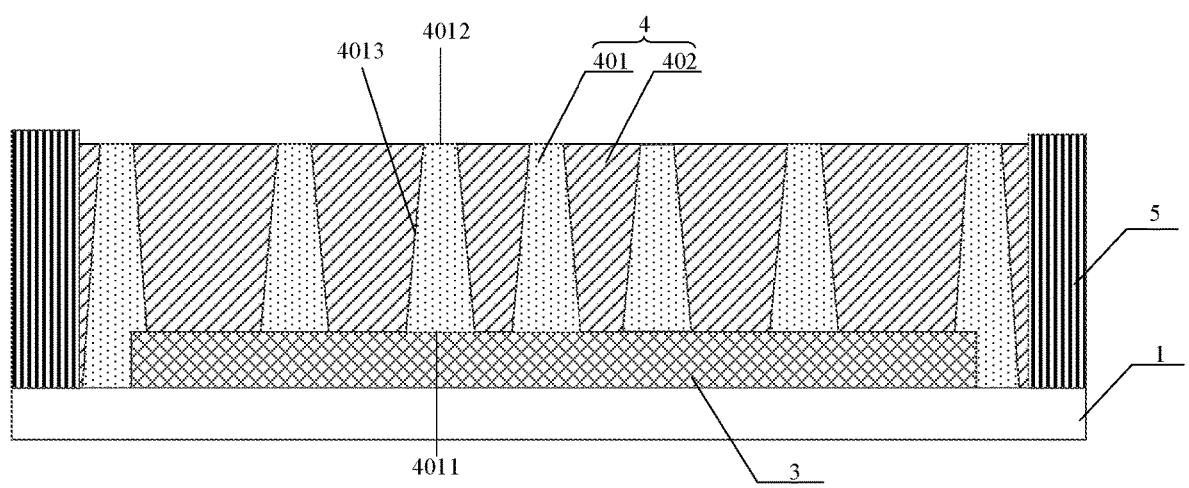
Figure 10C:
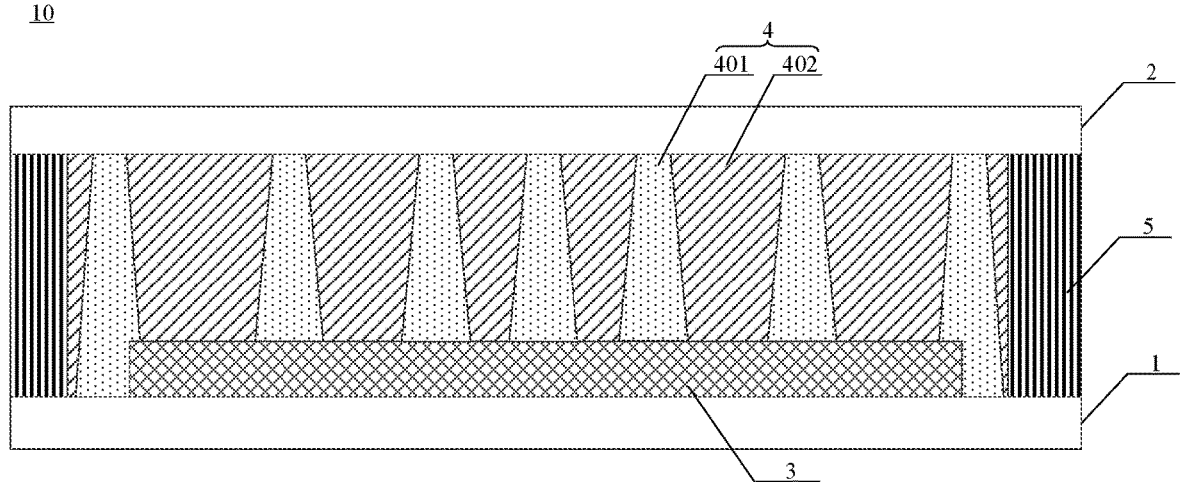

FIG. 9A-9F are schematic views of the method of manufacturing the light-emitting device provided by at least one embodiment of the present disclosure, FIG. 10A-10C are schematic views of another method of manufacturing the light-emitting device provided by at least one embodiment of the present disclosure, and FIG. 11A-11D are schematic views of further another method of manufacturing the light-emitting device provided by at least one embodiment of the present disclosure.

Exemplary, as illustrated in FIG. 9A, a base substrate 1 and an encapsulation cover plate 2 are provided. As illustrated in FIG. 9B, a light-emitting unit 3 is formed on the base substrate 1. For example, the light-emitting unit 3 includes an organic light-emitting diode (OLED) element, and a cathode, an organic light-emitting layer and a transparent anode can be successively formed on the base substrate 1. The cathode is a reflection electrode, or a reflection layer adjacent to the cathode is provided on the base substrate 1, in this case, the light emitting side of the light-emitting unit 3 is the top side of the light-emitting unit 3 illustrated in FIG. 9B. The light-emitting unit 3 can be formed referring to common techniques of the art as well.

The manufacturing method further includes forming a light-guiding structure 4 at a light exiting side of the light-emitting unit 3. For example, the light-guiding structure 4 is formed by a process of photolithography or embossing. Forming the light-guiding structure 4 includes forming a plurality of first structures 401 which are columnar (i.e., in a column shape). As illustrated in FIG. 9C, a first structure layer 401' is formed at the top side of the light-emitting unit 3, and the first structure layer 401' is used to form the first structures 401 of the light-guiding structure 4. For example, in a case where the material of the first structure layer 401' is the above-mentioned first photoresist material, the first structure layer 401' is formed by way of coating (e.g., spin coating or knife coating), etc. For example, in a case where the material of the first structure layer 401' is the above-mentioned first inorganic material, for example, the first inorganic material includes a material with a greater refractive index, such as silicon nitride, silicon dioxide or titanium dioxide, etc., the first structure layer 401' is formed by way of evaporation or chemical vapor deposition, etc.

For example, in a case where the material of the first structure layer 401' is the above-mentioned first photoresist material, the first structures 401 are formed by an exposure process with a mask and a development process. As illustrated in FIG. 9C, the first structure layer 401' is covered with a first mask 6 which includes an exposure region and a non-exposure region. For example, in a case where the material of the first structure layer 401' is a positive photoresist material, parts for forming the first structures 401, of the first structure layer 401', corresponds to the non-exposure region of the first mask 6, and other parts of the first structure layer 401' correspond to the exposure region of the first mask 6. By electing an appropriate exposure intensity, the exposure intensity of the parts of the first structure layer 401' corresponding to the exposure region decreases gradually from a position far from the base substrate 1 to a position close to the base substrate 1. In addition to the common mask illustrated in FIG. 9C, a gray tone mask or a halftone mask, including a full exposure region, a partial exposure region and a non-exposure region, can be used, so that the gray tone mask or halftone mask can be used for forming the light-guiding structure like a light-guiding column with a trapezoidal cross section.

The development process is carried out after the exposure process, and then the plurality of first structures 401 as illustrated in FIG. 9D are formed. The shape of a cross-section, along a direction perpendicular to the base substrate 1, of each of the plurality of first structures 401 of the light-guiding structure 4, is a trapezoid, and the length of the upper bottom of the trapezoid is less than the length of the lower bottom of the trapezoid. FIG. 9C illustrates the case where the first structures 401 with trapezoidal cross sections illustrated in FIG. 7A are formed of the positive photoresist material. For example, the first structures 401 illustrated in FIG. 7C are formed of a negative photoresist material. For example, in a case where the material of the first structure layer 401' is a negative photoresist material, parts for forming the first structures 401, of the first structure layer 401', corresponds to the exposure region of the first mask 6, and other parts of the first structure layer 401' correspond to the non-exposure region of the first mask 6. By electing an appropriate exposure intensity, the exposure intensity of the parts of the first structure layer 401' corresponding to the exposure region decreases gradually from the position far from the base substrate 1 to the position close to the base substrate 1. The development process is carried out after the exposure process, and then the plurality of first structures 401 as illustrated in FIG. 7C are formed. The shape of the cross-section, along the direction perpendicular to the base substrate 1, of each of the plurality of first structures 401 is a trapezoid, and the length of the upper bottom of the trapezoid is larger than the length of the lower bottom of the trapezoid. In a case where a large exposure intensity is used in the exposure process, from the position far from the base substrate 1 to the position close to the base substrate 1, the parts corresponding to the exposure region, of the first structure layer 401', is fully exposed. The development process is carried out after the exposure process, and then the plurality of first structures 401 as illustrated in FIG. 7B are formed. The shape of the cross-section, along the direction perpendicular to the base substrate 1, of each of the plurality of first structures 401 is a rectangle.

For example, the plane shapes of the plurality of first structures 401 are arranged along a plurality of concentric rings or in an array. Specific examples of the plane shapes of the plurality of first structures 401 can be referred to the descriptions in the above embodiments, and the plane shapes can be formed with a mask with a pattern corresponding to the plane shapes. For example, in a direction parallel to the base substrate 1, the size along the direction parallel to the base substrate 1, of a cross-section parallel to the base substrate 1, of each of the plurality of the first structures 401 is in micron level or nanometer level, for example, 8 μm~100 μm, or much smaller, such as 700 nm~900 nm. The above-mentioned values of the size of the first structures 401 are only some examples, and limitations are not imposed to this in the embodiments of the present disclosure. Thus the size of the first mask 6 is in micron level or nanometer level, the first mask 6 can be obtained according to appropriate techniques in the art and can design an exposure mode according to the specific plane shapes of the first structures 401, and limitations are not imposed to this in the embodiments of the present disclosure.

For example, in a case where the material of the first structure layer 401' is the above-mentioned first inorganic material, the first structures 401 can be formed by an exposure process with a mask, a development process, and an etching process. Forming the first structures 401 further includes coating a photoresist layer on the first structure layer 401'. Then the above-mentioned exposure process and the development process are carried on the photoresist layer, then after the etching (dry etching or wet etching) process and a peeling process of the remained photoresist, the first structures 401 are formed.

The first surfaces 4011, which face the base substrate 1, of the first structures 401 formed by the above-mentioned method in a central region of the light-emitting unit 3 contact with the surface, which is at the light emitting side, of the light-emitting unit 3; the bottom surfaces, which face the base substrate 1, of the first structures 401 in a marginal region of the light-emitting unit 3 contact with the base substrate 1, and for example the first structures 401 cover a side surface of the light-emitting unit 3 and a portion of the surface, which is at the light emitting side, of the light-emitting unit 3. In this way, a part of light emitted by the light-emitting unit 3 is incident into the first structures 401 through a first surface 4011 of the plurality of first structures 401, without passing through any other medium except the first surface 4011, so that the loss of light is reduced.

As illustrated in FIG. 9E, the method of manufacturing the light-emitting device further includes forming a frame sealant 5 in a peripheral region of the base substrate 1, and the frame sealant 5 is used to bonding the base substrate 1 with the encapsulation cover plate 2. For example, the frame sealant 5 is formed by coating. For example, the frame sealant 5 includes a glass sealant, etc. The frame sealant 5 bonds the base substrate 1 with the encapsulation cover plate 2 and form a sealed space for accommodating the light-emitting unit 3 is formed.

As illustrated in FIG. 9F, the method of manufacturing the light-emitting device further includes making the encapsulation cover plate 2 opposite to the base substrate 1 and bonding the encapsulation cover plate 2 with the base substrate 1, so that the light-emitting unit 3 and the light-guiding structure 4 are encapsulated between the encapsulation cover plate 2 and the base substrate 1, and the light-emitting device 10 is formed here. The second surfaces (end surfaces) 4012, which face the encapsulation cover plate 2, of the plurality of first structures 401 contact with the encapsulation cover plate 2. The encapsulation is carried out in an atmosphere of nitrogen or an inert gas, so multiple nitrogen or the inert gas fills in spaces among the columnar first structures 401. In this way, at least a part of the light emitted by the light-emitting unit 3 is directly incident into the first structures 401 through the first surface 4011 of the first structures 401, without passing through any other medium except the first surface 4011, and exits from the encapsulation cover plate 2. Because the refractive index of the material of the first structures 401 is greater than the refractive index of the nitrogen or the inert gas, in a case where light incident to the first surfaces 4011 of the first structures 401 reaches the interface of the first surfaces 4011 with the gas around the first surfaces, a part of the light is transmitted by total reflection on the interface (similar to that light is transmitted in an optical fiber). The light from the light-emitting unit 3, for example, is vertically or non-vertically incident to the first surface 4011 of the first structures 401, and the light is refracted into the first structures 401 which are columnar, then the light satisfying the condition of total reflection is transmitted to the second surfaces 4012 from the first surfaces 4011 of the first structures 401 after multiple total reflections, and exits through the encapsulation cover plate 2. A part of the light from the light-emitting unit 3 is vertically incident into the first structures 401, and this part of the light exits from the encapsulation cover plate 2 along the direction vertical to the encapsulation cover plate 2 without multiple reflections, so that the optical path is shortened, the loss of light caused by interface reflection, and the light emitting rate is increased. Not only the local light emitting efficiency at the positions of the first structures 401 is increased but also the overall light emitting ratio of the light-emitting unit 3 is increased, thus the utilization efficiency of light is increased accordingly.

For example, in another embodiment of the present disclosure, forming the light-guiding structure further includes forming a second structure 402. Based on the structure as illustrated in FIG. 9D, the second structure 402 is formed on the light-emitting unit 3, the second structure 402 covers a side surface 4013 of each of the first structures 401, and the second structure 402 fills in the spaces among the plurality of first structures 401. The refractive index of the material of the second structure 402 is less than the refractive index of the material of the first structures 401. For example, the material of the second structure 402 is the above-mentioned second inorganic material or the second photoresist material; the specific materials of the second structure 402 can be referred to the descriptions in the above embodiments. The specific method of forming the second structure 402 can be selected according to the type of the second structure 402. For example, in a case where the material of the second structure 402 is the above-mentioned second inorganic material, the second structure 402 is formed by way of evaporation or chemical vapor deposition, etc.; in a case where the material of the second structure 402 is the second photoresist material mentioned in the above embodiment, the second structure 402 is formed by way of coating. For example, the surface, which faces the encapsulation cover plate 2, of the second structure 402 of the light-guiding structure 4 and the first surface 4011, which faces the encapsulation cover plate 2, of the first structures 401 are roughly in a same plane, so the light-guiding structure 4 has a substantially flat upper surface, which is beneficial to arrange the encapsulation cover plate 2 on the upper surface and enable the encapsulation cover plate 2 to be bonded with the light-guiding structure 4 more tightly. In this way, on one hand, the optical path is shortened and an interface total reflection is reduced, thus the light emitting ratio is increased; on the other hand, a more tight seal is realized to protect the light-emitting unit 3 better and extend the service life of the light-emitting unit 3. As illustrated in FIG. 10B, the method of manufacturing the light-emitting device further includes forming a frame sealant 5, and the method of forming the frame sealant 5 can be referred to the description about FIG. 9E. As illustrated in FIG. 10C, the method of manufacturing the light-emitting device further includes making the encapsulation cover plate 2 be opposite to the base substrate 1 and bonding the encapsulation cover plate 2 with the base substrate 1, so that the light-emitting unit 3 and the light-guiding structure 4 are encapsulated between the encapsulation cover plate 2 and the base substrate 1, and the light-emitting device 10 is formed. The light-emitting device formed by the method illustrated in FIG. 10A-FIG. 10B has the technical effect similar to the technical effect of the light-emitting device formed by the method illustrated in FIG. 9A-FIG. 9F, and the technical effect can be referred to the above descriptions.

Figure 11A:
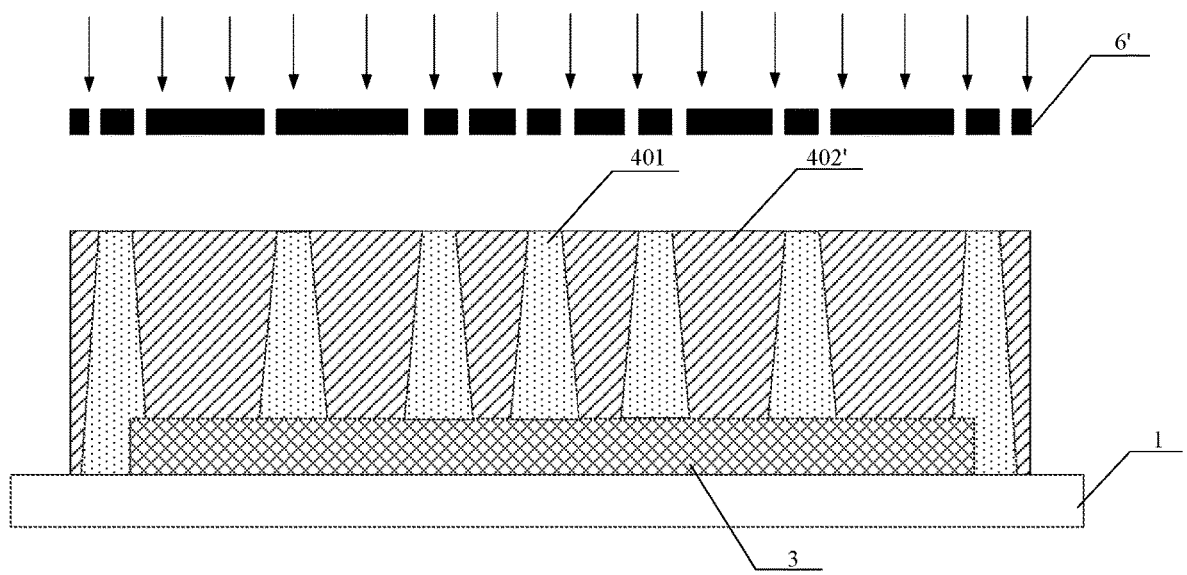
FIGS. 11A-11D are schematic views of further another method of manufacturing the light-emitting device provided by at least one embodiment of the present disclosure.
Figure 11B:
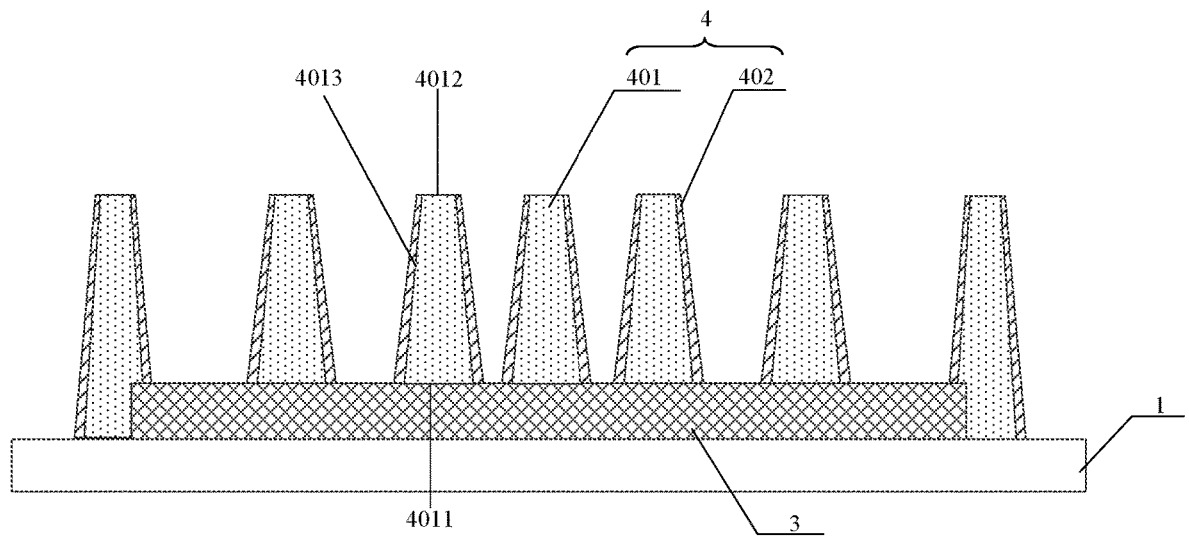
Figure 11C:
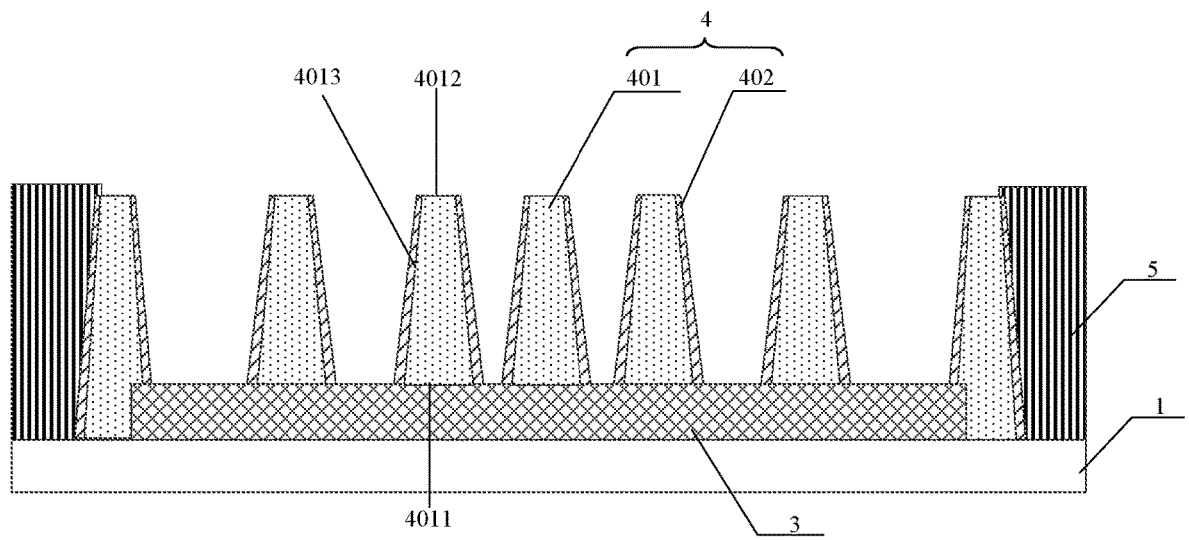
Figure 11D:
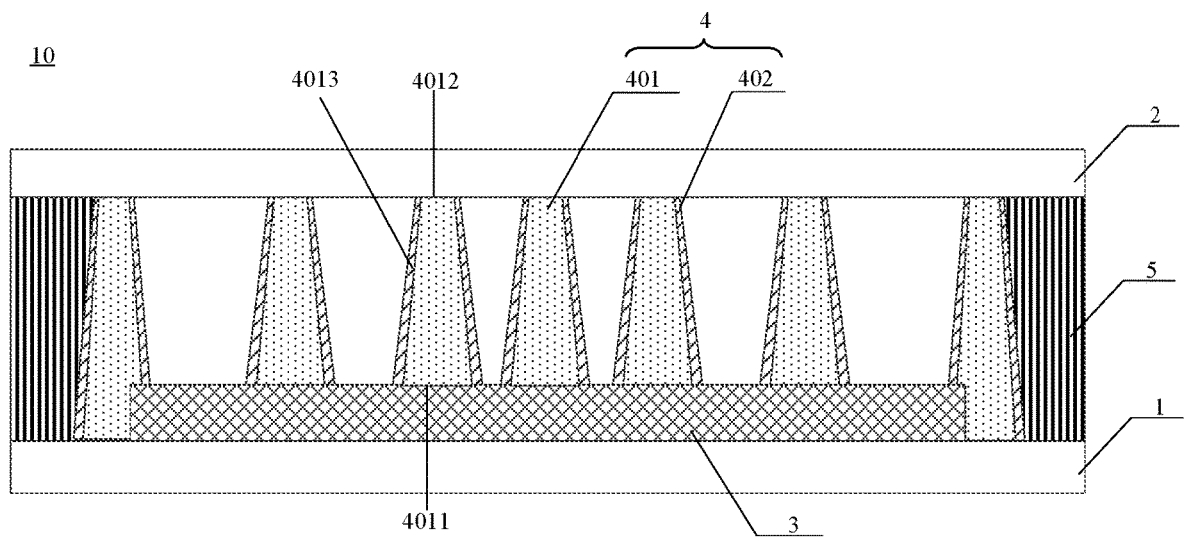

For example, in at least one embodiment of the present disclosure, the second structure 402 covers at least a portion of the surface, which faces the light emitting side, of the light-emitting unit, and the second structure 402 covers at least a portion of the side surface 4013 of each of the first structures 4, but the second structure 402 does not fill in all the space among the plurality of first structures 401. Exemplary, as illustrated in FIG. 11A, Based on the structure as illustrated in FIG. 9D, the method of manufacturing the light-emitting device further includes forming a second structure layer 402' on the light-emitting unit 3, and the second structure layer 402' is used to form the second structure 402. For example, the second layer 402' is patterned by a photolithography process or by an exposure-development process with a second mask 6', and a specific method of patterning can be referred to the above descriptions or be decided according to the material of the second structure layer 402'. In this way, the second structure 402 as illustrated in FIG. 11B is formed, the second structure 402 covers a side surface 4013 of each of the first structures 401, and the refractive index of the material of the second structure 402 is less than the refractive index of the material of the first structures 401. As illustrated in FIG. 11C, the method of manufacturing the light-emitting device further includes forming a frame sealant 5, and the method of forming the frame sealant 5 can be referred to the description about FIG. 9E. As illustrated in FIG. 11D, the method of manufacturing the light-emitting device further includes making the encapsulation cover plate 2 opposite to the base substrate 1 and bonding the encapsulation cover plate 2 with the base substrate 1, so that the light-emitting unit 3 and the light-guiding structure 4 are encapsulated between the encapsulation cover plate 2 and the base substrate 1, and the light-emitting device 10 is formed. The light-emitting device formed by the method illustrated in FIG. 11A-FIG. 11D has the technical effect similar to the technical effect of the light-emitting device formed by the method illustrated in FIG. 9A-FIG. 9F, and the technical effect can be referred to the above descriptions.

It should be noted that in the above embodiments, the first structures 401 of the light-guiding structure 4 are formed by a process of photolithography, in other embodiments, the first structures 401 of the light-guiding structure 4 can also be formed by a process of embossing. According to the shapes and a plane pattern of the first structures 401, an embossing plate can be obtained according to common techniques in the art and a specific method of embossing can be referred to common techniques in the art. The method of forming the first structures 401 can be determined according to the material of first structures 401.

Structural characteristics of the light-emitting device formed by the manufacturing method provided by the embodiments of the present disclosure are the same as structural characteristics of the light-emitting device provided by the embodiments of the present disclosure, and structural characteristics which are not mentioned in the embodiments about the manufacturing method, of the light-emitting device can be referred to the above descriptions.

The foregoing merely are exemplary embodiments of the disclosure, and not intended to define the scope of the disclosure, and the scope of the disclosure is determined by the appended claims.

What is claimed is:

1. A light-emitting device, comprising:
   a base substrate;
   a light-emitting unit on the base substrate;
   an encapsulation cover plate opposite to the base substrate and covering the light-emitting unit; and
   a light-guiding structure at a light exiting side of the light-emitting unit and comprising a plurality of first structures,
   wherein the light-guiding structure is configured to enable light emitted by the light-emitting unit to be incident into the first structures and enable the light to exit from the encapsulation cover plate,
   wherein the light-guiding structure further comprises a second structure, wherein the second structure covers side surfaces of each of the first structures, but the second structure does not fill in all space among the plurality of first structures, and
   wherein a refractive index of a material of the second structure is less than a refractive index of a material of the first structures.

2. The light-emitting device according to claim 1, wherein the light-guiding structure is between the light-emitting unit and the encapsulation cover plate, and an end surface, which faces the encapsulation cover plate, of the light-guiding structure contacts with the encapsulation cover plate.

3. The light-emitting device according to claim 1, wherein the material of the first structures is a transparent first inorganic material or a first photoresist material;
   the material of the second structure is a transparent second inorganic material or a second photoresist material; and
   the first transparent inorganic material is different from the second transparent inorganic material, and the first photoresist material is different from the second photoresist material.

4. The light-emitting device according to claim 1, wherein in a direction parallel to the base substrate, a size of a cross-section which is parallel to the base substrate, of each of the plurality of the first structures, is in micron level or nanometer level.

5. The light-emitting device according to claim 1, wherein plane shapes of the plurality of first structures are arranged in an array or along a plurality of concentric rings.

6. The light-emitting device according to claim 5, wherein the plane shapes of the plurality of first structures are arranged along the plurality of concentric rings, and wherein the plurality of first structures of the light-guiding structure have different arrangement densities along a radial direction of the concentric rings.

7. The light-emitting device according to claim 6, wherein along the radial direction of the concentric rings and along a direction from an innermost ring of the plurality of concentric rings to an outermost ring of the plurality of concentric rings, the arrangement densities decrease gradually.

8. The light-emitting device according to claim 1, wherein a shape of each of the plurality of first structures of the light-guiding structure is columnar, and a shape of a cross section along a direction perpendicular to the base substrate, of each of the plurality of first structures of the light-guiding structure, is a trapezoid or a rectangle.

9. The light-emitting device according to claim 1, wherein the light-emitting unit comprises an organic light-emitting diode (OLED) element or an electroluminescent (EL) element.

10. An electronic apparatus, comprising at least one light-emitting device according to claim 1.

11. A method of manufacturing a light-emitting device, comprising:
    providing a base substrate and an encapsulation cover plate;
    forming a light-emitting unit on the base substrate;
    forming a light-guiding structure at a light exiting side of the light-emitting unit; and
    enabling the encapsulation cover plate to be opposite to the base substrate and bonding the encapsulation cover plate and the base substrate, so that the light-emitting unit is encapsulated and is between the base substrate and the encapsulation cover plate,
    wherein the forming the light-guiding structure comprises:
      forming a plurality of first structures to enable light emitted by the light-emitting unit to be incident into the first structures and enable the light to exit from the encapsulation cover plate; and
      forming a second structure, wherein the second structure covers side surfaces of each of the first structures, but the second structure does not fill in all space among the plurality of first structures,
    wherein a refractive index of a material of the second structure is less than a refractive index of a material of the first structures.

12. The method of manufacturing the light-emitting device according to claim 11, wherein in a direction parallel to the base substrate, a size of a cross-section which is parallel to the base substrate, of each of the plurality of the first structures, is in micron level or nanometer level.

13. The method of manufacturing the light-emitting device according to claim 11, wherein plane shapes of the plurality of first structures are arranged in an array or along a plurality of concentric rings.

14. The method of manufacturing the light-emitting device according to claim 13, wherein the plane shapes of the plurality of first structures are arranged along the plurality of concentric rings, and wherein the plurality of first structures of the light-guiding structure have different arrangement densities along a radial direction of the concentric rings.

15. The method of manufacturing the light-emitting device according to claim 11, wherein the light-guiding structure is formed by a process of photolithography or embossing.

* * * * *